(12) United States Patent
Brodsky et al.

(10) Patent No.: US 7,310,585 B2
(45) Date of Patent: Dec. 18, 2007

(54) METHOD OF INSPECTING INTEGRATED CIRCUITS DURING FABRICATION

(75) Inventors: Colin J. Brodsky, Salt Point, NY (US);
MaryJane Brodsky, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 11/127,616

(22) Filed: May 12, 2005

(65) Prior Publication Data
US 2006/0258024 A1    Nov. 16, 2006

(51) Int. Cl.
H01L 21/00 (2006.01)
H01L 21/66 (2006.01)
(52) U.S. Cl. ........................................ 702/81
(58) Field of Classification Search ........... 702/81
See application file for complete search history.

(56) References Cited

U.S. PATENT DOCUMENTS

2005/0090027 A1* 4/2005 Aghababazadeh et al. .... 438/17

* cited by examiner

Primary Examiner—John Barlow
Assistant Examiner—Cindy Khuu
(74) Attorney, Agent, or Firm—Schmeiser, Olsen & Watts; Steven Capella

(57) ABSTRACT

A method and system for inspecting integrated circuit chips during fabrication. The method including: selecting an integrated circuit chip at a selected level of fabrication; determining coordinates of potential failures of the integrated circuit chip based on one or more risk of failure analyses performed ancillary to fabrication of the integrated circuit chip; automatically generating one or more enhanced defect inspection regions for inspecting the integrated circuit chip based on the coordinates; automatically selecting one or more enhanced defect inspection parameters for each of the one or more enhanced defect inspection regions based on the one or more risk of failure analyses; and generating an enhanced defect inspection recipe, the enhanced defect inspection recipe including a location on the integrated circuit chip, an enhanced defect inspection parameter and a value for the enhanced defect inspection parameter for each of the one or more enhanced defect inspection regions.

26 Claims, 5 Drawing Sheets

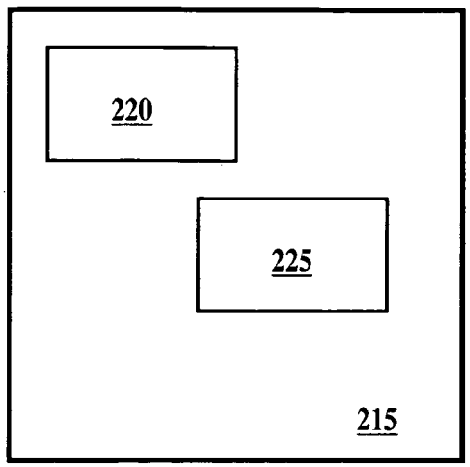
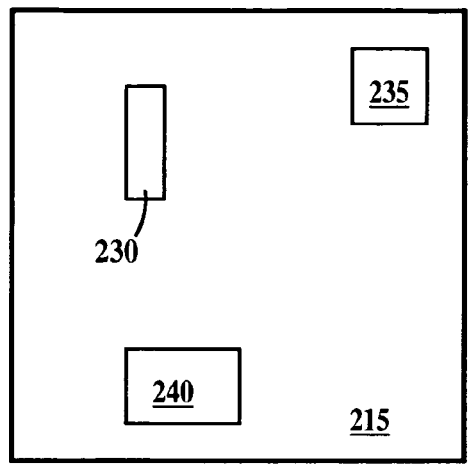
*FIG. 3A*  *FIG. 3B*
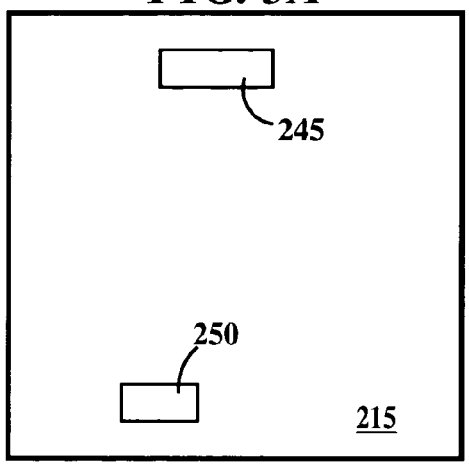
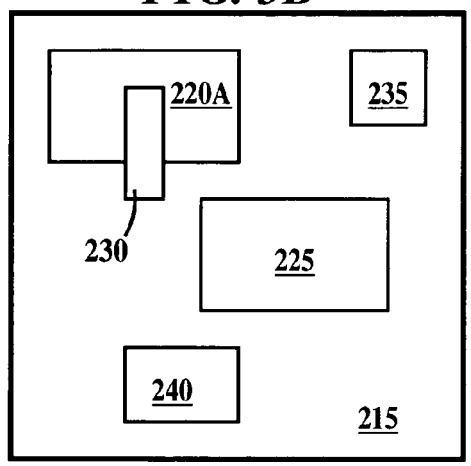
*FIG. 3C*  *FIG. 3D*
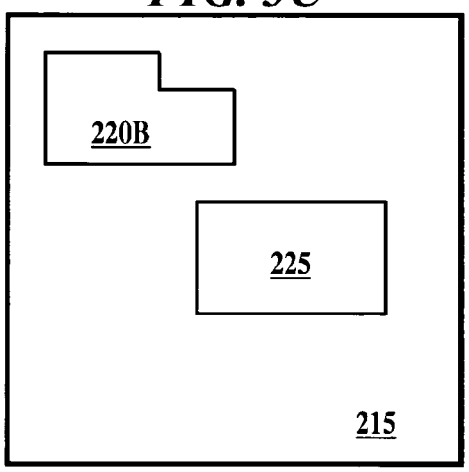
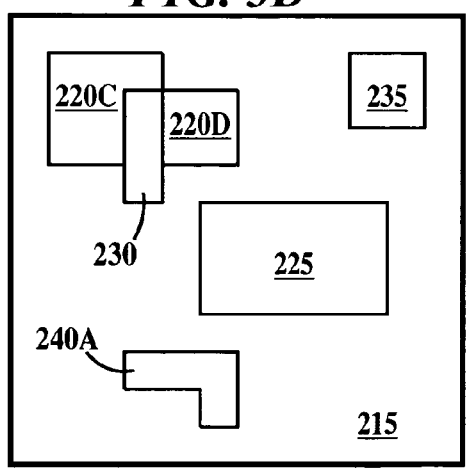
*FIG. 3E*  *FIG. 3F*

METHOD OF INSPECTING INTEGRATED CIRCUITS DURING FABRICATION

FIELD OF THE INVENTION

The present invention relates to the field of integrated circuit chip fabrication; more specifically, it relates method and system for inspecting integrated circuit chips for defects during fabrication of the integrated circuit chips.

BACKGROUND OF THE INVENTION

The fabrication of integrated circuit chips requires defect inspection of the integrated circuits at various levels of fabrication in order to obtain data that allows the yields and reliability to be increased and costs to be decreased. Defect inspection itself is a significant fabrication cost in terms of resource and time and therefore there is an ongoing need for methods for improving the effectiveness of defect inspection of integrated circuit chips during fabrication without adding excessive increased costs to the defect inspection process itself.

SUMMARY OF THE INVENTION

A first aspect of the present invention is a method, comprising: selecting an integrated circuit chip at a selected level of fabrication; determining coordinates of potential failures of the integrated circuit chip based on one or more risk of failure analyses performed ancillary to fabrication of the integrated circuit chip; automatically generating one or more enhanced defect inspection regions for inspecting the integrated circuit chip based on the coordinates; automatically selecting one or more enhanced defect inspection parameters for each of the one or more enhanced defect inspection regions based on the one or more risk of failure analyses; and generating an enhanced defect inspection recipe, the enhanced defect inspection recipe including a location on the integrated circuit chip, an enhanced defect inspection parameter and a value for the enhanced defect inspection parameter for each of the one or more enhanced defect inspection regions.

A second aspect of the present invention is a computer system comprising a processor, an address/data bus coupled to the processor, and a computer-readable memory unit coupled to communicate with the processor, the memory unit containing instructions that when executed implement a method for inspecting integrated circuit chips during fabrication, the method comprising the computer implemented steps of: selecting an integrated circuit chip at a selected level of fabrication; determining coordinates of potential failures of the integrated circuit chip based on one or more risk of failure analyses performed ancillary to fabrication of the integrated circuit chip; automatically generating one or more enhanced defect inspection regions for inspecting the integrated circuit chip based on the coordinates; automatically selecting one or more enhanced defect inspection parameters for each of the one or more enhanced defect inspection regions based on the one or more risk of failure analyses; and generating an enhanced defect inspection recipe, the enhanced defect inspection recipe including a location on the integrated circuit chip, an enhanced defect inspection parameter and a value for the enhanced defect inspection parameter for each of the one or more enhanced defect inspection regions.

The invention also encompasses computer program products for carrying out the methods of the invention.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 2:
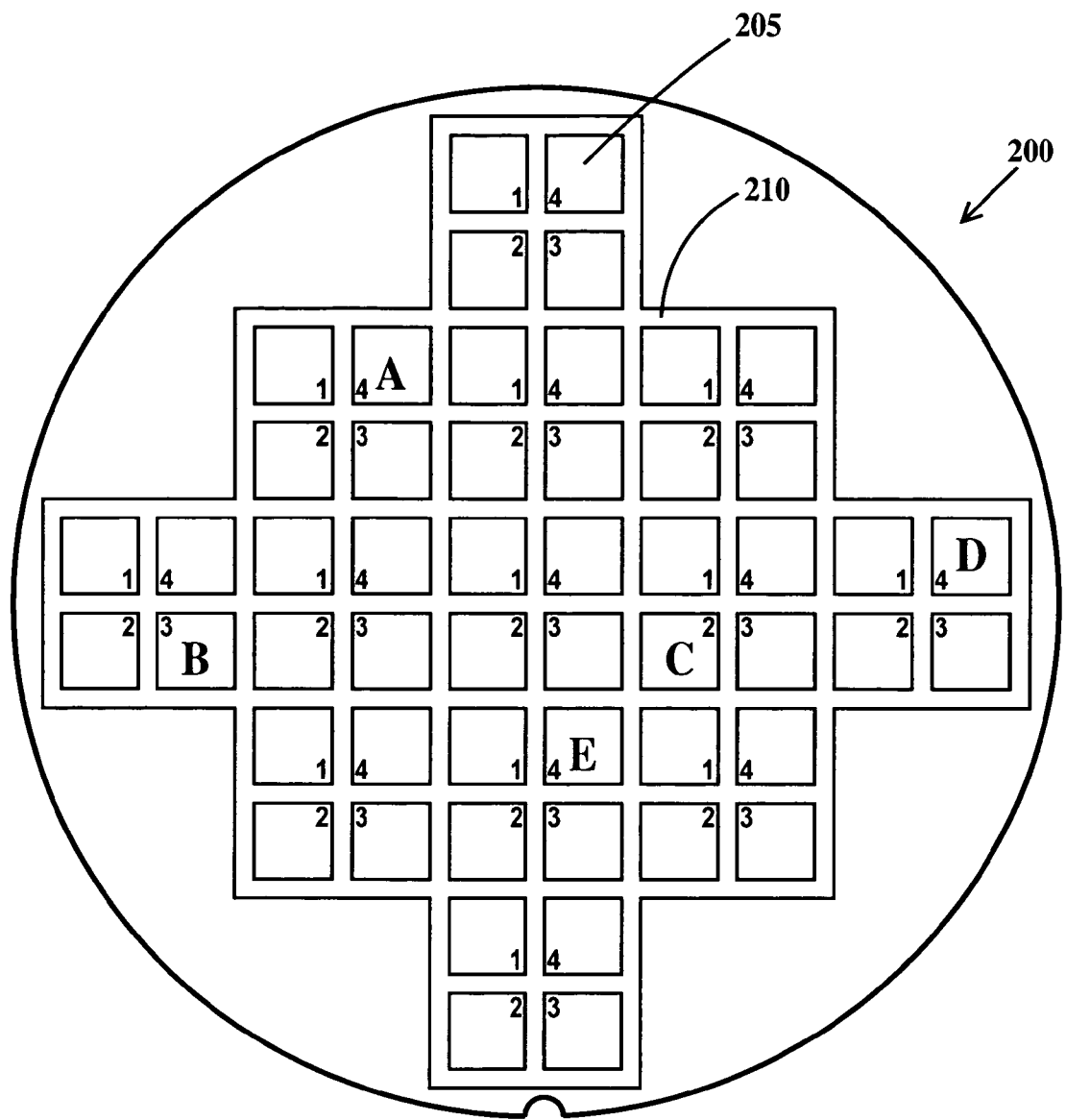
FIG. 2 is an illustration of an exemplary wafer on which multiple integrated circuit chips are fabricated.

Integrated circuit chips are fabricated on substrates called wafers. As illustrated in FIG. 2 and described infra, there are multiple integrated circuit chips on a wafer. Often, there are multiple wafers in a lot. A lot is a group of wafers that travel through the fabricator together and are processed similarly at about the same time. Defect inspections are generally performed at fabrication levels associated with a photolithographic process level. Defect inspection plans are often sample plans, where pre-specified wafers or randomly selected wafers of a lot of wafers are selected for the various defect inspections required for the various process levels. The same wafers may or may not be inspected at the different defect inspections. Defect inspections are generally performed using optical inspection tools such as KLA-Tencor Model 23XX series (including 2351, 2370, 2371, 2365), manufactured by KLA-Tencor, Milpitas, Calif. running edge and image density comparator software programs and voltage contrast scanning electron microscopes (SEMs) such as KLA-Tencor Model ES31 manufactured by KLA-Tencor, Milpitas, Calif. running edge and image density comparator software programs. For both types of tools, images are captured electronically as a set of grayscale pixels which are analyzed by the edge and density detection software programs.

Figure 1:
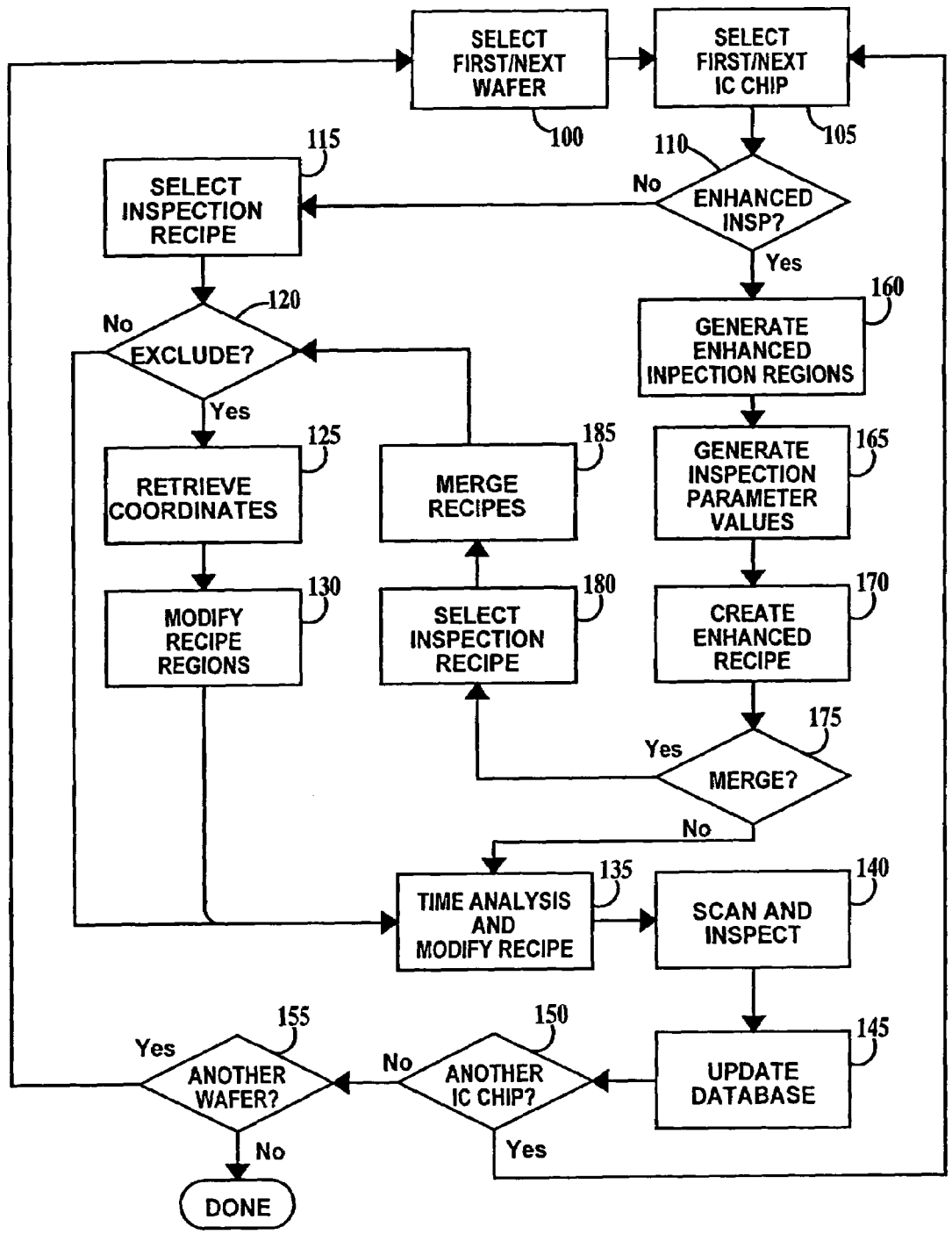
FIG. 1 is a flowchart of the method for inspecting integrated circuits during fabrication according to the present invention.

FIG. 1 is a flowchart of the method for inspecting integrated circuits during fabrication according to the present invention. The steps illustrated in FIG. 1 are repeated for each defect inspection level as a given lot of wafers is routed through during fabrication. In step 100, the first/next wafer to be inspected is selected and then in step 105, the first/next integrated circuit chip to be inspected of the previously selected wafer is selected. In step 110, it is determined if an enhanced defect inspection is to be performed. An enhanced defect inspection is an inspection in which the inspection regions and values for inspection parameters as defined infra are adjusted based on risk of failure analyses performed ancillary to fabrication of the integrated circuit chip.

If in step 110 it is determined that enhanced defect inspection is not required, then the method proceeds to step 115. In step 115, a standard defect inspection recipe is selected. A defect inspection recipe is a set of instructions issued to a defect inspection tool. A recipe includes which regions of the integrated circuit chip to inspect and what values of inspection parameters to use in each region. The inspection parameters include pixel size, threshold grayscale level, scan speed, light wavelength, illumination mode and acceleration voltage. Light wavelength and illumination mode apply only to optical defect inspection tools. Examples of illumination mode include edge contrast and bright field. Acceleration voltage is specific to SEM inspection tools. These parameters need not be the same for every integrated circuit chip inspected on a given wafer or the same from wafer to wafer in a lot or the same from lot to lot. Standard defect inspection recipes utilize pre-defined standard inspection regions and pre-defined values for defect inspection parameters and do not change from wafer to wafer in a lot or from lot to lot for a given integrated circuit chip design (or part number). Standard defect inspection recipes differ from enhanced defect inspection recipes in that standard defect inspection recipes tend to remain unchanged from integrated circuit chip to integrated circuit chip, wafer to wafer and lot to lot over extended periods of time, for example, over several weeks or months, while enhanced defect inspection recipes may be dynamically created for individual integrated circuit chips, though the same enhanced defect inspection recipe may be used for different integrated circuit chips, wafers of lots of wafers.

After a standard defect inspection recipe is selected in step 115, in step 120 it is determined if any regions of the integrated circuit chip are to be excluded. If in step 120, regions are to be excluded from inspection then in step 125, the coordinates of the exclusion regions are retrieved and in step 130, the inspection regions of the current defect inspection recipe are modified and the method proceeds to step 135. Locations on an integrated circuit chip are referenced by an X-Y coordinate system from a reference structure on the integrated circuit chip, usually in the kerf. There are many reasons why regions may be excluded from inspection. For example, a known mask defect causing repeating defects that would skew or degrade signal-to-noise for unknown defects in an otherwise random sample may be excluded by not inspecting a region around the coordinates of the known defect. For example, if inspection is stopped when a limit of 50 defects are found, a large number of these could be known defects and inspection would be stopped before unknown defects were found. SEM inspection is particularly susceptible to this problem. If in step 120, there are no regions to be excluded from inspection, then the method proceeds directly to step 135.

In step 135, an analysis of time to run the current recipe versus a maximum amount of inspection tool time allowed may be performed, and the recipe, particularly the inspection parameters, is adjusted according to predetermined priorities in a reiterate process until an acceptable inspection time results. Generally, for standard defect inspection recipes step 135 need not be performed.

In step 140, the integrated circuit chip is scanned and inspected and in step 145, the defect inspection database updated. Next in step 150, it is determined if another integrated circuit chip from the same wafer is to be inspected. If it is determined in step 150 that another integrated circuit chip from the same wafer is to be inspected, the method loops back to step 105, otherwise the method proceeds to step 155. Next in step 155, it is determined if another wafer from the same lot of wafers is to be inspected. If it is determined in step 155 that another lot is to be inspected, the method loops back to step 100, otherwise the method is complete.

Returning to step 110, if in step 110 it is determined that an enhanced defect inspection is to be performed, the method proceeds to step 160. In step 160, the coordinates for regions to receive enhanced defect inspections are selected and guard bands placed around the coordinates. In the case where a single coordinate point is retrieved, the guard band positions an inspection perimeter around that point to generate an enhanced defect inspection region. In the case where the region is already defined by retrieved coordinates, a guard band may or may not be placed around the region. Creation of enhanced defect inspection regions is based on one or more risk of failure analyses performed ancillary to fabrication of the integrated circuit, seven examples of which are given infra.

In a first example, creation of enhanced defect inspection regions may be based on optical rules checking (ORC). Optical rules checking is most commonly an advanced component of an optical proximity correction (OPC) process flow. In model-based OPC, a simulation model of the lithographic system (photomask, photolithographic tool and developing system) is employed to evaluate the effect of moving planned photomask image edges on a simulated developed image. Model convergence is achieved by comparing the result to the engineering specification for that image. This is done iteratively until the planned photomask edge placement corrections are either below the mask edge placement grid, in which case further corrections have no further impact on the simulated image, or an external constraint (such as mask build limitations on minimum chrome or clear sizes) is reached which prevents further edge movement, leaving the model converged to a sub-optimal solution. Particularly for cases where the model cannot achieve desired convergence due to external boundary restrictions, the OPC process flow ideally includes an ORC component that compares the simulated print image result against the engineering specifications for each part of the circuit layout. As part of this ORC process a rank ordered list is generated with the images furthest from convergence and not meeting their image size specifications and/or most likely to lead to catastrophic defects on wafer. For each ORC-flagged site, X-Y coordinates are generated.

In a second example, creation of enhanced defect inspection regions may be based on waivers to critical dimension restrictions of photoresist or etched images issued by engineering. The X-Y coordinates are generated via either automated searches for circuits in violation of the standard dimension restrictions or other tagging methods that identify the waivered regions.

In a third example, creation of enhanced defect inspection regions may be based on exposure tool topology data. Advanced photolithography tools have the capability for measuring local focus error across a simultaneously exposed swath of an integrated circuit chip and recording the value of the focus error in X-Y wafer coordinates. In one example, an enhanced defect inspection region is established for each focus error data point higher that a predetermined value. While, the adjustment of focus in an exposure tool based on a topographic surface map of the wafer is not ancillary to fabrication of the integrated circuit chip, analysis of the resulting focus error data for the purposes of defect inspection is ancillary because focus error is not an output of the exposure tool per se. The output of the exposure tool is a topographical map that can be converted to focus error.

In a fourth example, creation of enhanced defect inspection regions may be based on photomask inspection data such as the X-Y location on the mask reticle of repairs and printing simulation of photomask regions based on actual photomask measurements. As with ORC, the results of these print simulations may be ranked in order of risk; specifically the anticipated error from designed target dimension on wafer.

In a fifth example, creation of enhanced defect inspection regions may be based on physical failure analysis of similar or identical integrated circuit chips. It may be desirable to inspect circuits that are known to be failing on a regular or periodic basis more closely than would be possible with a standard defect inspection recipe.

In a sixth example, creation of enhanced defect inspection regions may be based on process-limited-yield (PLY) trends for the level being inspected. Frequency analysis of PLY data may be easily adapted to create and modify enhanced defect inspection regions.

In a seventh example, creation of enhanced defect inspection regions may be based on prior level defect inspection data. Often a defect detected on a prior level can cause defects in a later level.

All of the above analyses, singularly or in combination could be used to exclude regions from inspection as well as identify regions for enhanced defect inspection.

In step 165, the inspection parameter values for each enhanced defect inspection region are generated. As stated supra, inspection parameters include pixel size, threshold grayscale level, scan speed, light wavelength and mode. There are many ways inspection parameter values may be generated. In one example, a table of pre-selected inspection parameters is cross-referenced by the analyses used to generate the enhanced defect inspection region. For example, if the analyses used to generate the enhanced defect inspection region are ORC-based, a first set of defect inspection parameters is selected and if the analyses used to generate the enhanced defect inspection region are topology-based then a second set of inspection parameters may be selected. Within sets of defect inspection parameters, subsets of defect inspection parameter values may be selected. For example, the pixel size parameter may be set to different values based on ORC ranking, with higher ranking failures receiving smaller pixel sizes. In another example, the defect inspection parameters may be based on the minimum line width/space of the images or density in a given enhanced defect inspection region and the pixel size value selected on that basis, smaller images or denser regions getting smaller pixels.

Next in step 170, an enhanced defect inspection recipe is created. The enhanced defect inspection tool is similar to a standard defect inspection recipe described supra in reference to step 115. In step 175, it is determined if the enhanced defect inspection is to be performed alone or if it is to be merged with a standard defect inspection recipe. If the enhanced defect inspection is to be performed alone, the method proceeds to step 135, otherwise the method proceeds to step 180.

In step 180, a standard defect inspection recipe is selected similarly as to what was done in step 115 and in step 185, the standard and enhanced defect recipes are merged. In one example, the merging process minimizes the X-Y stage movements of the defect inspection tool. The method then proceeds to step 120.

FIG. 2 is an illustration of an exemplary wafer on which multiple integrated circuit chips are fabricated. In FIG. 2, a wafer 200 includes a multiplicity of integrated circuit chips 205 separated by a kerf regions (also known as streets) 210. In FIG. 2, there are 52 integrated circuit chips 205 in 13 groups of 4 chips. The groups of four occur because, in this example, the mask reticle contains four chips, 1, 2, 3 and 4. Since it is time/cost prohibitive to inspect all 52 chips on every lot of every wafer, sample plans are often used. For example, 13 defect inspection templates may be created, each inspecting a different four chips in different reticle positions, and a different template, in rotation, used for each wafer inspected. Since not all wafers in a lot may be inspected at any given level, the rotation of templates may extend across different wafers of different lots. The enhanced defect inspection method of the present invention may require overriding the templates in cases, for example when the enhanced defect inspection region is the result of mask data affecting only one chip on a multi-chip reticle. For example, if a template calls for four integrated circuit chips having chips A, B, C and D indicated to be inspected, but integrated circuit chip E on a different set of four chips has been identified for an enhanced defect inspection, integrated circuit chip E may be added to the template or substituted for another chip in the same reticle position in the template. In the present example, assuming substitution is chosen, integrated circuit chip E would be substituted for integrated circuit chip D. Integrated circuit chip E is by definition, inspected in enhanced defect inspection mode, but it is possible for the defect inspection recipes (excluding inspection region) of the A, B, C and E integrated circuit chips to otherwise be the same. In the case of a single integrated circuit chip reticle, integrated circuit chip E may be substituted for any of integrated circuit chips A, B, C and D.

FIGS. 3A through 3F illustrate inspection regions of integrated circuit chips according to the present invention. In FIG. 3A, standard defect inspection regions 220 and 225 are illustrated relative to an integrated circuit chip 215. In FIG. 3B, enhanced defect inspection regions 230, 235 and 240 are illustrated relative to integrated circuit 215. In FIG. 3C, excluded inspection regions 245 and 250 are illustrated relative to integrated circuit 215. Regions 245 and 250 are regions of integrated circuit chip 215 not to be inspected. There are four ways to combine FIGS. 3A, 3B and 3C to obtain inspection regions (and corresponding inspection parameter values) according to the present invention.

Figure 3G:
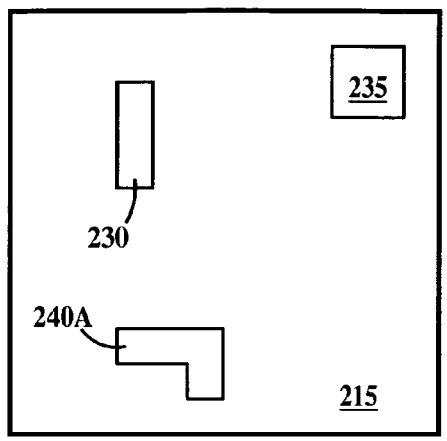
FIGS. 3A through 3F illustrate inspection regions of integrated circuit chips according to the present invention.

In FIG. 3D, standard defect inspection regions 220 (see FIG. 3A) and 225 and enhanced defect inspection regions 230, 235 and 240 are merged and are illustrated relative to integrated circuit 215. It should be noted a new standard defect inspection region 220A is defined which excludes all regions of standard defect inspection region 220 (see FIG. 3A) overlapped by enhanced defect inspection region 230 in order to avoid duplicate inspection. In FIG. 3E, standard defect inspection regions 220 (see FIG. 3A) and 225 and excluded from inspection regions 245 and 250 are merged and are illustrated relative to integrated circuit 215. It should be noted a new standard defect inspection region 220B is defined which excludes all regions of standard defect inspection region 220 (see FIG. 3A) overlapped by excluded inspection region 245. In FIG. 3F, standard defect inspection regions 220 (see FIG. 3A) and 225, enhanced defect inspection regions 230, 235 and 240 (see FIG. 3D) and excluded inspection regions 245 and 250 (see FIG. 3C) are merged and are illustrated relative to integrated circuit 215. It should be noted new standard defect inspection regions 220C and 220D are defined which excludes all regions of standard defect inspection region 220 (see FIG. 3A) overlapped by enhanced defect inspection region 230 and excluded region 245 (see FIG. 3C). In FIG. 3G, enhanced defect inspection regions 230, 235 and 240 (see FIG. 3B) are merged and new enhanced defect inspection region 240A defined.

Figure 4:
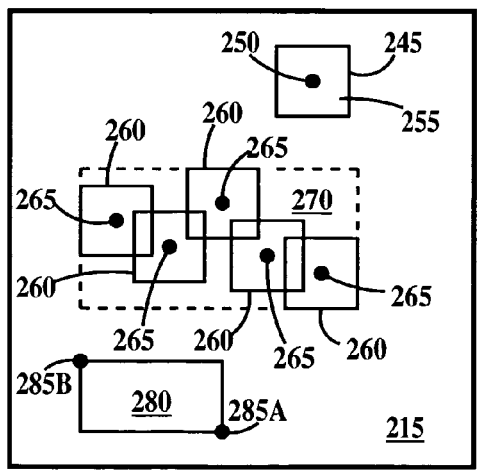
FIG. 4 is a diagram illustrating inspection region generation according to the present invention.

FIG. 4 is a diagram illustrating inspection region generation according to the present invention. In FIG. 4, three exemplary methods for generating enhanced defect inspection regions on integrated circuit chip 215 are illustrated. In a first method a guard band 245 having a four sides equidistance from an X-Y coordinate point 250 and parallel to the sides of integrated circuit chip 215 defines an enhanced defect inspection region 255. In a second method, a series of guard bands 260 each having sides equidistant from corresponding X-Y coordinate points 265 and parallel to the sides of integrated circuit chip 215 are integrated to define the smallest possible rectangular shape for an enhanced defect inspection region 270. In a third method, two coordinate points 285A and 285B define an enhanced defect inspection region 280 having sides parallel to the ides of integrated circuit chip 215.

Figure 5:
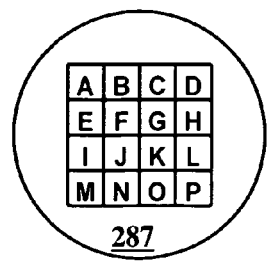
FIG. 5 is a diagram illustrating inspection scanning of an inspection region of an integrated circuit according to the present invention.

FIG. 5 is a diagram illustrating inspection scanning of an inspection region of an integrated circuit according to the present invention. In FIG. 5, a wafer 287 includes integrated circuit chips A through P. In order to inspect integrated circuit chip B, integrated circuits chips A, B and C are inspected and compared. In order to inspect integrated circuit chip K, integrated circuits chips J, K and L are inspected and compared. This procedure is repeated until all integrated circuit chips called out by the current template as incorporated into the defect inspection recipe have been inspected. For edge integrated circuit chips (A, E, I, M, D, H, K and P), the two previous or subsequent integrated circuits in the scan order are used in the three-way comparison.

There is also an array mode inspection which is performed in a manner similar to chip-chip inspections. In this case, you may have a steadily repeating structure like SRAM or a test macro within a chip, the various instances of the repeating structure would be compared to each other. Determinations to perform enhanced defect inspection or eliminate inspection regions also apply to these repeating structures.

Figure 6:
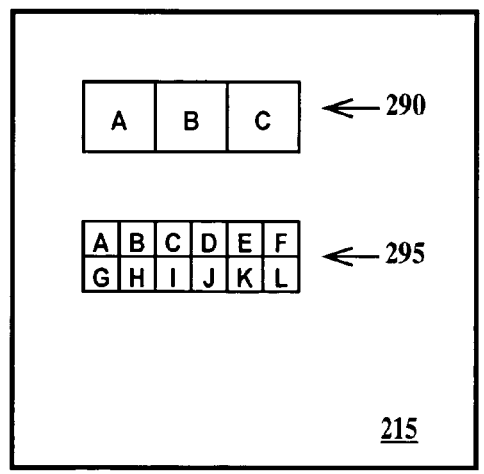
FIG. 6 is a diagram illustrating adjustment of pixel size according to the present invention.

FIG. 6 is a diagram illustrating adjustment of pixel size according to the present invention. In FIG. 6, a standard defect inspection region 290 and an enhanced defect inspection region 295 are identical in size and shape. However, standard defect inspection region 290 contains only three pixels A, B and C while enhanced defect inspection region contains 12 pixels A through L.

Figure 7:
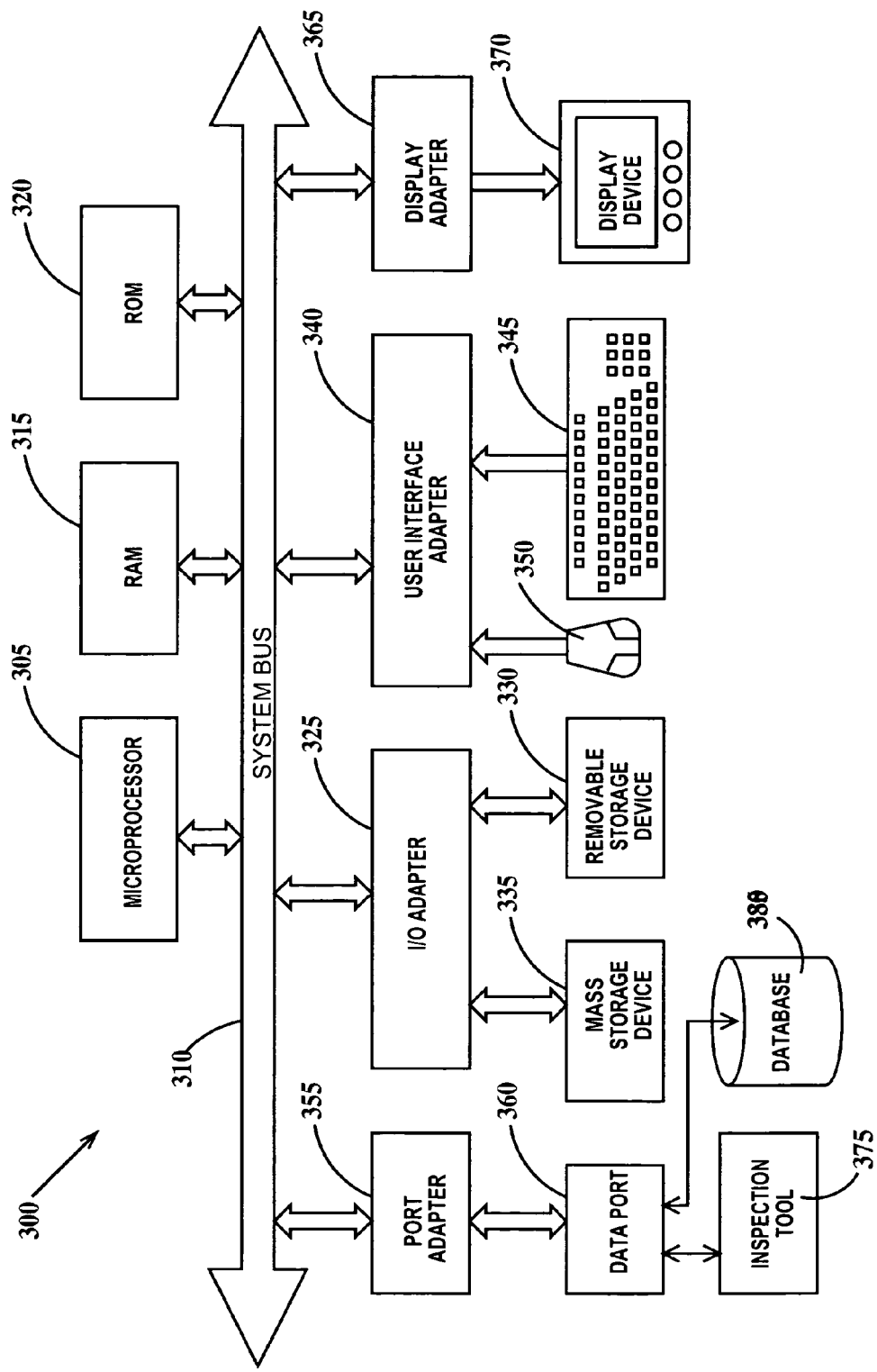
FIG. 7 is a schematic block diagram of a general-purpose computer for practicing the present invention.

Generally, the method described herein with respect to inspecting integrated circuits during fabrication is practiced with an inspection tool under the control of a general-purpose computer and the method may be coded as a set of instructions on removable or hard media for use by the general-purpose computer. FIG. 7 is a schematic block diagram of a general-purpose computer for practicing the present invention. In FIG. 7, computer system 300 has at least one microprocessor or central processing unit (CPU) 305. CPU 305 is interconnected via a system bus 310 to a random access memory (RAM) 315, a read-only memory (ROM) 320, an input/output (I/O) adapter 325 for a connecting a removable data and/or program storage device 330 and a mass data and/or program storage device 335, a user interface adapter 340 for connecting a keyboard 345 and a mouse 350, a port adapter 355 for connecting a data port 360 and a display adapter 365 for connecting a display device 370. Data port 360 is optionally linked to inspection tools 375 in order to transfer the defect inspection recipes directly to the inspection tools. Alternatively, the defect inspection recipes may be written to removable storage device 330 and the removable storage device placed into a I/O adapter of an inspection tool, to transfer the defect inspection recipe to the defect inspection tool. Data port 360 is linked to databases 380 containing the data from the risk of failure analyses performed ancillary to fabrication of the integrated circuit described supra. Database 380 is linked to all of the systems within the integrated circuit fabricator that required to select inspection regions and parameters for those inspection regions.

ROM 320 contains the basic operating system for computer system 300. The operating system may alternatively reside in RAM 315 or elsewhere as is known in the art. Examples of removable data and/or program storage device 330 include magnetic media such as floppy drives and tape drives and optical media such as CD ROM drives. Examples of mass data and/or program storage device 335 include hard disk drives and non-volatile memory such as flash memory. In addition to keyboard 345 and mouse 350, other user input devices such as trackballs, writing tablets, pressure pads, microphones, light pens and position-sensing screen displays may be connected to user interface 340. Examples of display devices include cathode-ray tubes (CRT) and liquid crystal displays (LCD).

A computer program in a computer-readable medium with an appropriate application interface may be created by one of skill in the art and stored on the system or a data and/or program storage device to simplify the practicing of this invention. In operation, information for or the computer program created to cause one or more computers to carry out a method of the present invention is loaded on the appropriate removable data and/or program storage device 330, fed through data port 360 or typed in using keyboard 345.

Thus the present invention provides a method, system and computer program product for improving the effectiveness of defect inspection of integrated circuit chips during fabrication without adding excessive increased costs to the defect inspection process itself.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:

selecting an integrated circuit chip at a selected level of fabrication;

determining coordinates of potential failures of said integrated circuit chip based on one or more risk of failure analyses performed ancillary to fabrication of said integrated circuit chip;

automatically generating one or more enhanced defect inspection regions for inspecting images of said integrated circuit chip based on-said coordinates;

automatically selecting one or more enhanced defect inspection parameters for each of said one or more enhanced defect inspection regions based on said one or more risk of failure analyses;

generating an enhanced defect inspection recipe, said enhanced defect inspection recipe including locations of said one or more enhanced defect inspection regions on said integrated circuit chip, an enhanced defect inspection parameter and a value for said enhanced defect inspection parameter for each of said one or more enhanced defect inspection regions; and placing said integrated circuit chip into an image based defect inspection tool capable of edge and image density comparisons and performing an inspection evaluating potential defects based on images from at least one of said one or more enhanced defect inspection regions and said enhanced defect inspection recipe.

2. The method of claim 1, further including:

performing an analysis of an amount of time required to inspect said integrated circuit chip using said enhanced defect inspection recipe and modifying said enhanced defect inspection recipe if said amount of time exceeds a predetermined amount of inspection time.

3. The method of claim 1, further including:

removing one or more pre-determined defect inspection regions from said enhanced defect inspection recipe.

4. The method of claim 1, further including:

selecting a standard defect inspection recipe for said integrated circuit chip, said standard defect inspection recipe including one or more predefined standard defect inspection regions and corresponding predefined standard defect inspection parameters and predefined standard defect inspection parameter values.

5. The method of claim 4, further including:

merging said standard defect inspection recipe with said enhanced defect inspection recipe to generate a merged defect inspection recipe.

6. The method of claim 5, further including:

performing an analysis of an amount of time required to inspect said integrated circuit chip using said merged defect inspection recipe and modifying said merged defect inspection recipe if said amount of time exceeds a predetermined amount of inspection time.

7. The method of claim 5, further including:

removing one or more pre-determined defect inspection regions from said merged defect inspection recipe.

8. The method of claim 1, wherein said risk of failure analyses is based on optical rules checking simulation of the design of said integrated circuit chip, waivers to line/space specifications of said integrated circuit chip, exposure tool topology data of an exposure tool used to fabricate said integrated circuit chip said at said selected level of fabrication of said integrated circuit chip, photomask inspection and simulation data of a photomask used to fabricate said integrated circuit chip at said selected level of fabrication of said integrated circuit chip, physical failure analysis of other integrated circuit chips similar to said integrated circuit chip, process-limited-yield trends of said selected level of fabrication of said integrated circuit chip, prior level defects of said integrated circuit chip or combinations thereof.

9. The method of claim 1, wherein said defect inspection parameters are selected from the group consisting of pixel size, threshold grayscale level, scan speed, light wavelength, illumination mode and acceleration voltage.

10. The method of claim 1, wherein each of said one or more enhanced defect regions is a less than whole portion of an active area of said integrated circuit chip.

11. The method of claim 1, wherein said image based defect inspection tool is an optical inspection tool.

12. The method of claim 1, wherein said image based defect inspection tool is scanning electron microscope.

13. The method of claim 1, wherein said defects are detectable by viewing an image of said defects.

14. A computer system comprising a processor, an address/data bus coupled to said processor, and a computer-readable memory unit coupled to communicate with said processor, said memory unit containing instructions that when executed implement a method for inspecting integrated circuit chips during fabrication, said method comprising the computer implemented steps of:

selecting an integrated circuit chip at a selected level of fabrication;

determining coordinates of potential failures of said integrated circuit chip based on one or more risk of failure analyses performed ancillary to fabrication of said integrated circuit chip;

automatically generating one or more enhanced defect inspection regions for inspecting said integrated circuit chip based on-by placing a guard band around said coordinates;

automatically selecting one or more enhanced defect inspection parameters for each of said one or more enhanced defect inspection regions based on said one or more risk of failure analyses;

generating an enhanced defect inspection recipe, said enhanced defect inspection recipe including locations of said one or more enhanced defect inspection regions on said integrated circuit chip, an enhanced defect inspection parameter and a value for said enhanced defect inspection parameter for each of said one or more enhanced defect inspection regions; and writing said enhanced defect inspection recipe to a removable storage media or loading said enhanced defect inspection recipe into a memory of an imaged based defect inspection tool capable of edge and image density comparisons capable and capable of performing an inspection evaluating potential defects based on images from at least one of said one or more enhanced defect inspection regions and said enhanced defect inspection recipe.

15. The system of claim 14, the method further including the step of:

performing an analysis of an amount of time required to inspect said integrated circuit chip using said enhanced defect inspection recipe and modifying said enhanced defect inspection recipe if said amount of time exceeds a predetermined amount of inspection time.

16. The system of claim 14, the method further including the step of:

removing one or more pre-determined defect inspection regions from said enhanced defect inspection recipe.

17. The system of claim 14, the method further including the step of:

selecting a standard defect inspection recipe for said integrated circuit chip, said standard defect inspection recipe including one or more predefined standard defect inspection regions and corresponding predefined standard defect inspection parameters and predefined standard defect inspection parameter values.

18. The system of claim 17, the method further including the step of:

merging said standard defect inspection recipe with said enhanced defect inspection recipe to generate a merged defect inspection recipe.

19. The system of claim 18, the method further including the step of:

performing an analysis of an amount of time required to inspect said integrated circuit chip using said merged defect inspection recipe and modifying said merged defect inspection recipe if said amount of time exceeds a predetermined amount of inspection time.

20. The system of claim 18, the method further including the step of:

removing one or more pre-determined defect inspection regions from said merged defect inspection recipe.

21. The system of claim 14, wherein said risk of failure analyses is based on optical rules checking simulation of the design of said integrated circuit chip, waivers to line/space specifications of said integrated circuit chip, exposure tool topology data of an exposure tool used to fabricate said integrated circuit chip said at said selected level of fabrication of said integrated circuit chip, photomask inspection and simulation data of a photomask used to fabricate said integrated circuit chip at said selected level of fabrication of said integrated circuit chip, physical failure analysis of other integrated circuit chips similar to said integrated circuit chip, process-limited-yield trends of said selected level of fabrication of said integrated circuit chip, prior level defects of said integrated circuit chip or combinations thereof.

22. The system of claim 14, wherein said defect inspection parameters are selected from the group consisting of pixel size, threshold grayscale level, scan speed, light wavelength, illumination mode and acceleration voltage.

23. The system of claim 14, wherein each of said one or more enhanced defect regions is a less than whole portion of an active area of said integrated circuit chip.

24. The system of claim 14, wherein said image based defect inspection tool is an optical inspection tool.

25. The system of claim 14, wherein said image based defect inspection tool is scanning electron microscope.

26. The system of claim 14, wherein said defects are detectable by viewing an image of said defects.

* * * * *